United States Patent
Chmelar et al.

(10) Patent No.: US 7,973,692 B2
(45) Date of Patent: Jul. 5, 2011

(54) SYSTEMS AND METHODS FOR SYNCHRONOUS, RETIMED ANALOG TO DIGITAL CONVERSION

(75) Inventors: Erik Chmelar, Midland, MI (US); Choshu Ito, San Mateo, CA (US); William Loh, Fremont, CA (US)

(73) Assignee: LSI Corporation, Milpitas, CA (US)

( * ) Notice: Subject to any disclaimer, the term of this patent is extended or adjusted under 35 U.S.C. 154(b) by 42 days.

(21) Appl. No.: 12/669,482

(22) PCT Filed: Jun. 6, 2008

(86) PCT No.: PCT/US2008/066074
§ 371 (c)(1),
(2), (4) Date: Jan. 16, 2010

(87) PCT Pub. No.: WO2009/148458
PCT Pub. Date: Dec. 10, 2009

(65) Prior Publication Data
US 2010/0195776 A1    Aug. 5, 2010

(51) Int. Cl.
*H03M 1/36* (2006.01)
(52) U.S. Cl. ........................................ 341/159; 341/155
(58) Field of Classification Search .................. 341/155, 341/159
See application file for complete search history.

(56) References Cited

U.S. PATENT DOCUMENTS

| | | | |
|---|---|---|---|
| 4,672,518 A | 6/1987 | Murdock | |
| 4,686,617 A | 8/1987 | Colton | |
| 4,837,495 A | 6/1989 | Zansky | |
| 4,885,674 A | 12/1989 | Varga et al. | |
| 4,918,450 A | 4/1990 | Sugiyama et al. | |
| 5,072,221 A | 12/1991 | Schmidt | |
| 5,173,698 A | 12/1992 | Gulczynski | |
| 5,182,477 A | 1/1993 | Yamasaki et al. | |
| 5,225,837 A | 7/1993 | Hosotani et al. | |
| 5,272,701 A | 12/1993 | Tsuruoka | |
| 5,296,856 A | 3/1994 | Mantong | |
| 5,418,493 A | 5/1995 | Dijkmans | |
| 5,510,745 A | 4/1996 | Hamano et al. | |
| 5,623,265 A * | 4/1997 | Pawar et al. | 341/160 |
| 5,689,178 A | 11/1997 | Otake | |
| 5,734,297 A | 3/1998 | Huijsing et al. | |
| 5,789,973 A | 8/1998 | Barrett et al. | |
| 5,801,564 A | 9/1998 | Gasparik | |
| 5,809,060 A | 9/1998 | Cafarella et al. | |

(Continued)

OTHER PUBLICATIONS

U.S. Appl. No. 12/024/893, filed Feb. 1, 2008, Bailey.*

(Continued)

*Primary Examiner* — Khai M Nguyen
(74) *Attorney, Agent, or Firm* — Hamilton DeSanctis & Cha

(57) ABSTRACT

Various embodiments of the present invention provide systems and methods for analog to digital conversion. For example, a latch based analog to digital converter is disclosed that includes a first interleave with a set of comparators, a selector circuit and a latch. The set of comparators is operable to compare an analog input with respective reference voltages, and is synchronized to a clock phase. The selector circuit is operable to select an output of one of the set of comparators based at least in part on a selector input. A first interleave output is derived from the selected output. The latch receives a second interleave output from a second interleave and is transparent when the clock phase is asserted. The selector input includes an output of the latch.

20 Claims, 8 Drawing Sheets

U.S. PATENT DOCUMENTS

| | | | |
|---|---|---|---|
| 5,861,829 | A | 1/1999 | Sutardja |
| 5,874,911 | A | 2/1999 | Kodama |
| 5,929,705 | A | 7/1999 | Zhang et al. |
| 5,936,466 | A | 8/1999 | Andoh et al. |
| 6,002,356 | A | 12/1999 | Cooper |
| 6,011,502 | A | 1/2000 | Kao |
| 6,081,219 | A | 6/2000 | Prasanna |
| 6,111,467 | A | 8/2000 | Luo |
| 6,181,269 | B1 | 1/2001 | Nishiuchi et al. |
| 6,225,859 | B1 | 5/2001 | Irvine et al. |
| 6,232,908 | B1 | 5/2001 | Nakaigawa |
| 6,369,743 | B2 | 4/2002 | Ono |
| 6,373,423 | B1 | 4/2002 | Knudsen |
| 6,404,372 | B1 | 6/2002 | Heithoff |
| 6,404,374 | B1 | 6/2002 | Yu et al. |
| 6,542,104 | B1 * | 4/2003 | Capofreddi ............ 341/160 |
| 6,556,081 | B2 | 4/2003 | Muza |
| 6,556,158 | B2 | 4/2003 | Steensgaard-Madsen |
| 6,563,445 | B1 | 5/2003 | Sabouri |
| 6,580,382 | B2 | 6/2003 | Yung |
| 6,600,373 | B1 | 7/2003 | Bailey et al. |
| 6,605,993 | B2 | 8/2003 | Suzuki |
| 6,653,966 | B1 | 11/2003 | Van der Goes et al. |
| 6,717,945 | B1 | 4/2004 | Jue et al. |
| 6,744,432 | B1 | 6/2004 | Morein |
| 6,756,841 | B2 | 6/2004 | Jaussi et al. |
| 6,784,824 | B1 | 8/2004 | Quinn |
| 6,816,101 | B2 | 11/2004 | Hietala et al. |
| 6,922,083 | B2 | 7/2005 | Tanaka et al. |
| 6,956,519 | B1 | 10/2005 | Huang et al. |
| 7,002,504 | B2 | 2/2006 | McMahill |
| 7,019,507 | B1 | 3/2006 | Dittmer et al. |
| 7,116,260 | B2 | 10/2006 | Luh |
| 7,129,874 | B2 | 10/2006 | Bjornsen |
| 7,190,298 | B2 | 3/2007 | Mulder |
| 7,209,068 | B1 | 4/2007 | Chen et al. |
| 7,233,277 | B2 | 6/2007 | Roh |
| 7,262,724 | B2 | 8/2007 | Hughes et al. |
| 7,333,580 | B2 | 2/2008 | Parhi |
| 7,362,153 | B2 | 4/2008 | Sumesaglam |
| 7,372,390 | B2 * | 5/2008 | Yamada ............ 341/155 |
| 7,471,228 | B2 * | 12/2008 | Cho et al. |
| 7,474,239 | B2 * | 1/2009 | Su et al. ............ 341/120 |
| 7,482,844 | B2 * | 1/2009 | Brady et al. |
| 7,696,915 | B2 * | 4/2010 | Chmelar |
| 2002/0186776 | A1 * | 12/2002 | Cosand |
| 2005/0151588 | A1 * | 7/2005 | Bailey et al. |
| 2006/0071709 | A1 * | 4/2006 | Malobert |
| 2006/0132242 | A1 * | 6/2006 | Han et al. |
| 2007/0183006 | A1 * | 8/2007 | Lee |
| 2008/0048896 | A1 * | 2/2008 | Parthasarthy et al. |

OTHER PUBLICATIONS

U.S. Appl. No. 12/024,909, filed Feb. 1, 2008, Bailey.*
U.S. Appl. No. 12/025,897, filed Nov. 20, 2007, Bailey et al.*
U.S. Appl. No. 12/025,914, filed Nov. 20, 2007, Bailey et al.*
U.S. Appl. No. 12/134,488, filed Jun. 6, 2008, Chmelar.*
U.S. Appl. No. 12/134,501, filed Jun. 6, 2008, Chmelar.*
U.S. Appl. No. 12/134,523, filed Jun. 6, 2008, Chmelar.*
U.S. Appl. No. 12/669,481, filed Jun. 6, 2008, Chmelar.*
Brandt et al., "A 75-mW, 10-b, 10 MSPS CMOS Subranging ADC with 9.5 Effective Bits at Nyquist", IEEE J. Solid State Circuits, vol. 34, No. 12, pp. 1788-1795, Dec. 1999.
Diato et al., "A 14-bit 20-MS/s Pipelined ADC With Digital Distortion Calibration," IEEE J. Solid-State Circuits, vol. 41, No. 11, pp. 2417-2423. Nov. 2006.
Gupta, et al., "A 1GS/s 11b Time Interleaved ADC in 0.13um CMOS", ISSCC Dig. Tech. Papers, pp. 576-577, Feb. 2006.
Katsuria, S. et al., "Techniques for High-Speed Implementationof Nonlinear Cancellation", IEEE Joun. Communications, vol. 9, No. 5, Jun. 1991, pp. 711-717.
Kim et al., "A 10-b, 10MS/s CMOS A/D Converter", IEEE J. Solid State Circuits, vol. 32, No. 3, pp. 302-311, Mar. 1997.
Mangelsdorf, C.W., "A 400-MHz Input Flash Converter With Error Correction", IEEE Journal of Solid-State Circuits, pp. 184-191, Feb. 1990, vol. 25 Issue 1.
Mehr, et al., "A 55-mW, 10-bit, 40 -Msample/s Nyquist-Rate CMOS ADC," IEEE J. Solid-State Circuits, vol. 35, No. 3, pp. 302-311, Mar. 2000.
Nagaraj et al., "A 250 mW 8-b, 52 Msamples/s Parallel-Pipelined A/D Converter with Reduced Number of Amplifiers", IEEE J. Solid State Circuits, vol. 32, pp. 312-320, Mar. 1997.
Schinkel, Daniel et al. A double- Tail Latch-Type Voltage Sense Maplifier with 18ps Setup+Hold Time, Feb. 13, 2007, ISSCC 2007, Session 13, pp. 314-315 and 605 IEEE.
Schmid & Moschtz, "A Tunable, Video-Frequency, Low Power Single Amplifier Biquadratic Filter in CMOS", Circuits and Systems, 1999, ISCAS'99. IEEE Int. Sym. on vol. 2, May 2, 5 pages.
Sedra, Adel S. et al. "Optimum Configurations for Single-Amplifier Biquadratic Filters" Dec. 1980, IEEE Trans. on Cir. and Sys., vol. CAS-27, No. 12, pp. 1155-1163.
Singer et al., "A 14-bit 10-MHz Calibrations-Free CMOS Pipelined A/D Converter," in Symp. VLSI Circuits Dig. Tech Papers, Jun. 1996, pp. 94-95.

* cited by examiner

SYSTEMS AND METHODS FOR SYNCHRONOUS, RETIMED ANALOG TO DIGITAL CONVERSION

BACKGROUND OF THE INVENTION

The present inventions are related to systems and methods for processing digital signals, and more particularly to systems and methods for analog to digital conversion.

Analog to digital converters are used in a number of semiconductor devices to convert an analog electrical signal to a digital representation thereof. In the conversion process, a continuous analog signal is converted to a series of discrete or quantized digital values representing the analog signal at defined sample times. Simple analog to digital converters operate over a specified, static range of operation typically defined to encompass an expected analog input signal. FIG. 1 depicts an exemplary prior art flash analog to digital converter 100. Flash analog to digital converter 100 includes a comparator bank 120 including a number of comparators 121, 122, 123, 124, 125 that each receive a respective reference threshold (i.e., ref(n−1), ref(n−2), ref(3), ref(2) and ref(1)). In addition, each of comparators 121, 122, 123, 124, 125 receives an analog input 105, and compares analog input 105 to the respective reference threshold. The reference thresholds are chosen such that the combined output of comparator bank 120 is a thermometer code indicated as a digital output 170. When operating properly, digital output 170 includes an uninterrupted series of 0's followed by an uninterrupted series of is with the transition between 0s and is indicating the level of analog input 105 (i.e., a thermometer code without bubbles). In some cases, digital output 170 is provided to an encoder 180 that provides an encoded output 190 that may be more compact than a thermometer code.

In such a flash analog to digital converter, increased resolution is provided by reducing the level difference between successive reference voltages. Where the range of analog to digital converter 100 is to be maintained constant, increasing resolution requires a corresponding increase in the number of comparators. This has at least two disadvantages. First, additional comparators increase power and area consumption. Second, noise on analog input 105 and process differences in comparators 121, 122, 123, 124, 125 often results in production of an imperfect thermometer code (i.e., a thermometer code exhibiting bubbles) where the difference between successive reference voltages becomes small. Consequently, to compensate for the imperfections in the thermometer code, the complexity of encoder 180 increases substantially. This results in additional undesirable power and area costs.

Hence, for at least the aforementioned reasons, there exists a need in the art for advanced systems and methods for analog to digital conversion.

BRIEF SUMMARY OF THE INVENTION

The present inventions are related to systems and methods for processing digital signals, and more particularly to systems and methods for analog to digital conversion.

Various embodiments of the present invention provide latch based analog to digital converters. The latch based analog to digital converters include a first interleave with a set of comparators, a selector circuit and a latch. The set of comparators is operable to compare an analog input with respective reference voltages, and is synchronized to a clock phase. The selector circuit is operable to select an output of one of the set of comparators based at least in part on a selector input. A first interleave output is derived from the selected output.

As used herein, the term "derived" is used in its broadest sense. Thus, as an example, the first interleave output derived from the selected output may be the same as the selected output. In other cases, the selected output may be buffered, registered or otherwise modified before becoming the first interleave output. The latch receives a second interleave output from a second interleave and is transparent when the clock phase is asserted. The selector input includes an output of the latch. In some instances of the aforementioned embodiments, the latch operates to mitigate inter symbol interference.

Other embodiments of the present invention provide methods for analog to digital conversion. The methods include providing a first interleave operable to generate a first output and a second interleave operable to generate a second output. Each of the first interleave and the second interleave includes a set of comparators, a selector circuit, and a latch. The methods include performing a set of analog to digital conversions using the set of comparators of the first interleave synchronous to a clock phase; selecting a result from the set of analog to digital conversions based at least in part on a latched result to provide the first output; and latching the second output using the latch of the first interleave. The latch is transparent when the clock phase is asserted, and the latched result includes an output of the latch.

Yet other embodiments of the present invention provide communication systems. Such communication systems include a receiver utilizing at least one latch based analog to digital converter. The latch based analog to digital converter includes a first interleave with a set of comparators, a selector circuit and a latch. The set of comparators is operable to compare an analog input with respective reference voltages, and is synchronized to a clock phase. The selector circuit is operable to select an output of one of the set of comparators based at least in part on a selector input. A first interleave output is derived from the selected output. The latch receives a second interleave output from a second interleave and is transparent when the clock phase is asserted. The selector input includes an output of the latch. In some instances of the aforementioned embodiments, the latch operates to mitigate inter symbol interference.

In some instances of the aforementioned embodiments, the systems include a transmitter and a medium. In such instances, information is provided from the transmitter to the receiver via the medium. In one particular case, the system is a storage system, and the medium is a storage medium. In another particular case, the system is a wireless communication system, and the medium is a wireless communication medium.

This summary provides only a general outline of some embodiments of the invention. Many other objects, features, advantages and other embodiments of the invention will become more fully apparent from the following detailed description, the appended claims and the accompanying drawings.

BRIEF DESCRIPTION OF THE DRAWINGS

A further understanding of the various embodiments of the present invention may be realized by reference to the figures which are described in remaining portions of the specification. In the figures, like reference numerals are used throughout several figures to refer to similar components. In some instances, a sub-label consisting of a lower case letter is associated with a reference numeral to denote one of multiple similar components. When reference is made to a reference numeral without specification to an existing sub-label, it is intended to refer to all such multiple similar components.

FIG. 3b is a timing diagram depicting an exemplary operation of the latch based analog to digital converter of FIG. 3a;

FIG. 4a depicts another latch based analog to digital converter in accordance with various embodiments of the present invention;

FIG. 4b is a timing diagram depicting an exemplary operation of the latch based analog to digital converter of FIG. 4a;

FIG. 5b is a timing diagram depicting an exemplary operation of the latch based analog to digital converter of FIG. 5a;

FIG. 6b is a timing diagram depicting an exemplary operation of the latch based analog to digital converter of FIG. 6a.

DETAILED DESCRIPTION OF THE INVENTION

The present inventions are related to systems and methods for processing digital signals, and more particularly to systems and methods for analog to digital conversion.

A dynamic range analog to digital converter is a special purpose analog to digital converter that may be used for detecting a bit sequence transmitted through a known channel. An example of a dynamic analog to digital converter is described in U.S. patent application Ser. No. 12/108,791 entitled "Analog-To-Digital Converter" and filed Apr. 24, 2008 by Chmelar et al. The aforementioned application is incorporated herein by reference for all purposes. Such a dynamic analog to digital converter employs one or more comparators that compare an input against a reference voltage. The output of the dynamic analog to digital converter may then be used to select an input range for comparison during a subsequent bit period.

Figure 2A:
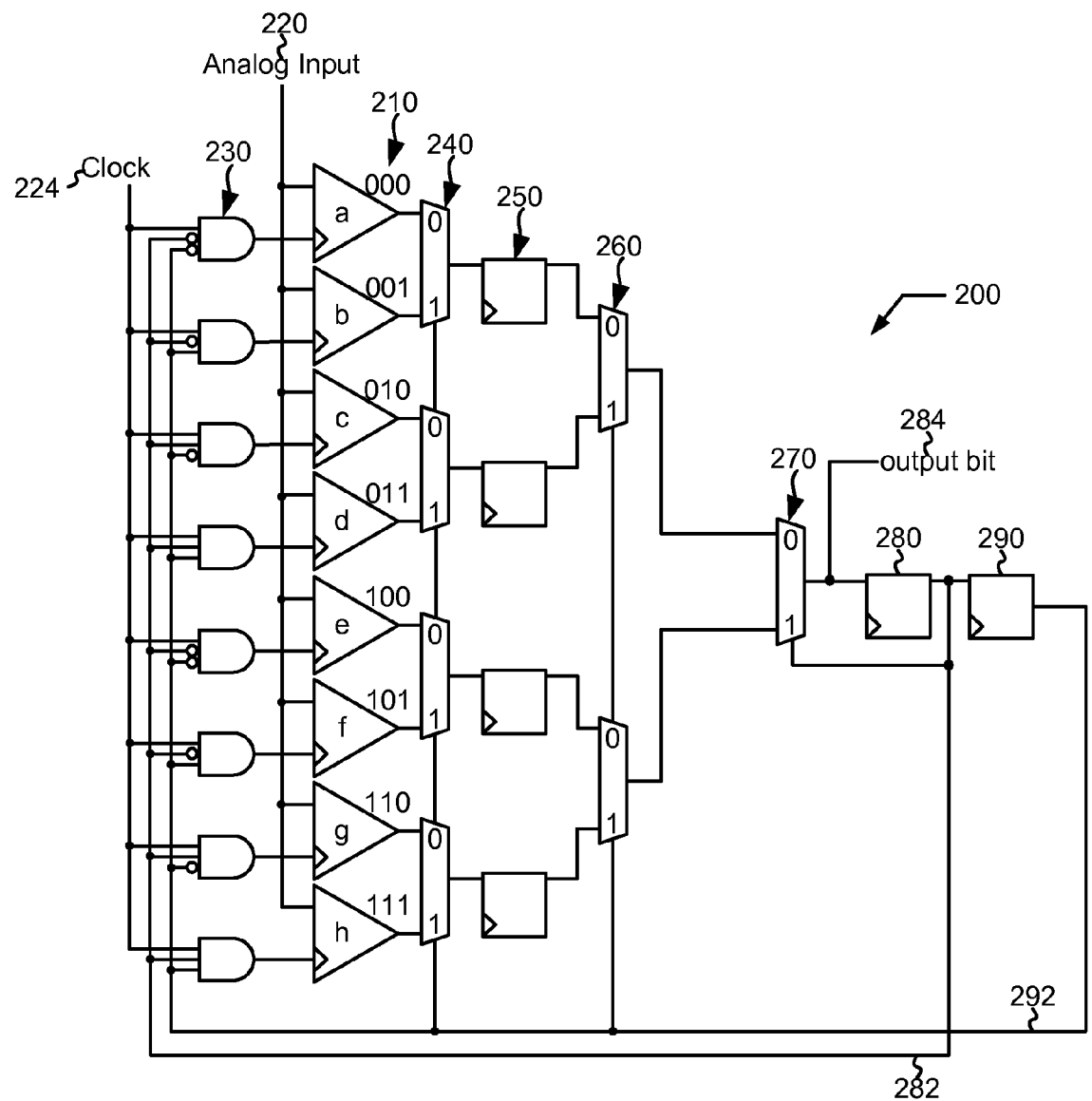
FIG. 2a is an analog to digital converter using a multiplexer tree implemented in combinatorial logic in accordance with some embodiments of the present invention.
Figure 2B:
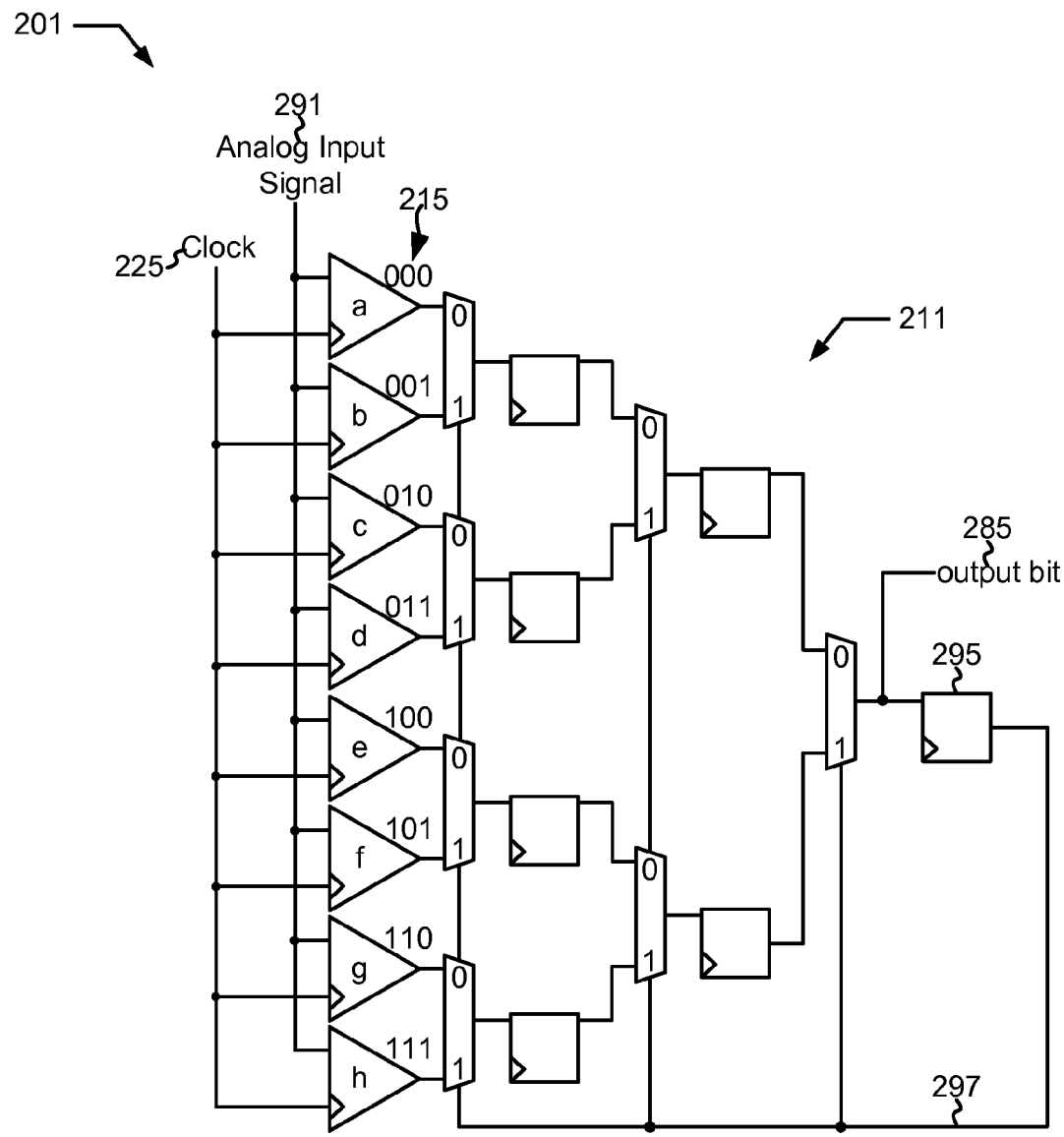
FIG. 2b is another analog to digital converter using a multiplexer tree implemented in synchronized combinatorial logic in accordance with one or more embodiments of the present invention.

As described in U.S. patent application Ser. No. 12/134, 488 entitled "Systems and Methods for Analog to Digital Conversion" and filed on a date even herewith by Chmelar et al., an analog to digital converter may be unified with a modified Decision Feedback Equalization (DFE) circuit to yield an advantage in predicting a future range for a dynamic analog to digital converter. The aforementioned application is incorporated herein by reference for all purposes. In particular, the incorporated DFE may reduce or eliminate intersymbol interference that occurs in relation to processing a serial bit sequence in a channel. FIG. 2a and FIG. 2b depict two examples of analog to digital converters that are incorporated with a modified DFE. In such cases, the analog to digital converters use some level of pipelining implemented using a multiplexer tree and intervening registers.

Turning to FIG. 2a, a unified analog to digital converter 200 using a DFE for range selection is depicted. Analog to digital converter 200 utilizes a multiplexer tree similar to that disclosed in U.S. patent application Ser. No. 12/134,523 and filed on a date even herewith by Gribok et al. The aforementioned application is assigned to an entity common hereto, and is incorporated herein by reference for all purposes. Analog to digital converter 200 includes a bank of eight comparators 210 that each compare an analog input 220 against respective reference voltages (not shown). In particular, a distinct reference voltage is provided to each of comparators 210 with the reference voltages extending across the input range of analog to digital converter 200. In some cases, the respective reference voltages are programmable such that the input range of analog to digital converter 200 can be adjusted. Each of comparators 210 is clocked by a respective gated clock that is generated by a bank of AND gates 230. Each of AND gates 230 logically ANDs a clock input 224 with a combination of an enable bit 282 and an enable bit 292. In particular, one quarter of comparators 210 (i.e., comparators a, e) are clocked whenever enable bit 282 and enable bit 292 are both asserted low, and a clock input 224 is asserted high. One quarter of comparators 210 (i.e., comparators d, h) are clocked whenever enable bit 282 and enable bit 292 are both asserted high, and clock input 224 is asserted high. One quarter of comparators 210 (i.e., comparators b,f) are clocked whenever enable bit 282 is asserted low, enable bit 292 is asserted high, and clock input 224 is asserted high. One quarter of comparators 210 (i.e., comparators c, g) are clocked whenever enable bit 282 is asserted high, enable bit 292 is asserted low, and clock input 224 is asserted high. In this way, power is only being dissipated by one quarter of comparators 210 during any given bit period. As more fully discussed in the above mentioned reference that is incorporated herein by reference for all purposes, more enable bits may be generated by saving additional history information which can result in enabling a smaller percentage of comparators 210, or fewer enable bits may be generated in which case a larger percentage of comparators 210 may be clocked on any given clock cycle.

An output bit 284 is equivalent to the output of one of comparators 210 asserted one bit period prior, enable bit 282 is equivalent to the output of one of comparators 210 asserted two bit periods prior, and output bit 292 is equivalent to the output of one of comparators 210 asserted three bit periods prior, with all three being based on previous bit assertions as selected by a synchronized multiplexer tree comprising a first tier of multiplexers 240, a first tier of flip-flops 250, a second tier of multiplexers 260, and a third tier multiplexer 270. Enable bit 282 is stored in a flip-flop 280, and output bit 292 is stored in a flip-flop 290. Enable bits 282, 292 are provided to AND gates 230 to enable clocking of a selected subset of comparators 210. Further, enable bit 292 drives the selector input of the multiplexers in first tier multiplexers 240 and second tier multiplexers 260. Enable bit 282 drives the selector input of third tier multiplexer 280.

Turning to FIG. 2b, another analog to digital converter 201 using a multiplexer tree 211 implemented in synchronized combinatorial logic is depicted. Analog to digital converter 201 includes a number of comparators 215 that each compare an analog input 291 against respective reference voltages (not shown) that span the input range of analog to digital comparator 201. In particular, a distinct reference voltage is provided to each of comparators 215 with the reference voltages extending across the input range of analog to digital converter 201. In some cases, the respective reference voltages are programmable such that the input range of analog to digital converter 201 can be adjusted. An output bit 285 of one of comparators 215 is selected using multiplexer tree 211. Output bit 285 is selected based on prior determined outputs such that inter symbol interference is reduced. In particular, output bit 285 is provided to a flip-flop 295. A single enable bit 297 provided from flip-flop 295 is used as a selector input to the different tiers of multiplexer tree 211. The outputs of each tier of multiplexer tree 211 are synchronized to clock signal 225 using flip-flops. In this way, enable bit 297 from flip-flop 295 receives three successive values of output bit 285 (i.e., the value of output bit 285 from three successive bit periods). The three successive values of output bit 285 are used to move a respective comparator output from one of comparators 215 through multiplexer tree 211 until the output is provided as output bit 285.

Even with extremely fast comparators, the analog to digital converters discussed in relation to FIG. 2a and FIG. 2b offer a maximum data rate of approximately:

$$t_{cq}+t_{mux}+t_{su}<T,$$

where T is the period of the clock used to synchronize the analog to digital converter, $t_{cq}$ is the time required to stabilize a newly clocked flip-flop output, and $t_{su}$ is a setup time for an intervening flip-flop. The maximum data rate is limited regardless of the levels of interleaving, pipelining depth, or speculation bits utilized. This is because flip-flops are used to transfer data between clock periods. Such flip-flops can be very slow circuit elements. For example, in some technologies, the combination of $t_{cq}$ and $t_{su}$ may be 180 ps. Where a data rate of six giga bits per second is desired, the combination of $t_{cq}$ and $t_{su}$ exceeds the clock period (T) making the above described circuits unable to achieve the desired result.

Figure 3A:
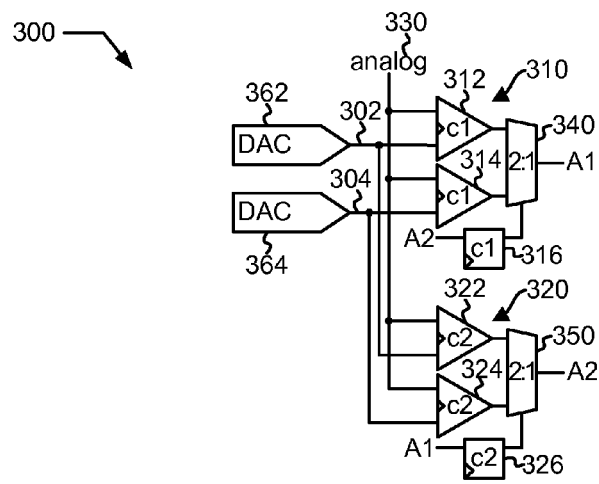
FIG. 3a depicts a latch based analog to digital converter in accordance with some embodiments of the present invention.

Turning to FIG. 3a, a latch based analog to digital converter 300 is depicted in accordance with some embodiments of the present invention. Latch based analog to digital converter 300 incorporates a one tap DFE with one bit of speculation and two levels of interleave. In particular, latch based analog to digital converter 300 includes two sub-level interleaves 310, 320. Sub-level interleave 310 includes two comparators 312, 314 that each receive a respective reference voltage 302, 304 that are compared against an analog input 330. Comparators 312, 314 are both synchronized to a clock phase c1. The output of either comparator 312 or comparator 314 is selected using a multiplexer 340 based on an output A2 from sub-level interleave 320. In particular, output A2 is transferred to the select input of multiplexer 340 using a latch 316 that is synchronized to clock phase c1. An output A1 is provided from multiplexer 340.

Sub-level interleave 320 includes two comparators 322, 324 that each receive a respective reference voltage 302, 304 that are compared against analog input 330. Comparators 322, 324 are both synchronized to a clock phase c2. The output of either comparator 322 or comparator 324 is selected using a multiplexer 350 based on output A1 from sub-level interleave 310. In particular, output A1 is transferred to the select input of multiplexer 350 using a latch 326 that is synchronized to a clock phase c2. Output A2 is provided from multiplexer 340.

Reference voltages 302, 304 may be provided from respective one of digital to analog converters 362, 364. Digital to analog converters 362, 364 may receive digital inputs from some programmable device (not shown) that allow for modification of reference voltages 302, 304. In other cases, reference voltages 302, 304 may be provided from a resistor chain. Based on the disclosure provided herein, one of ordinary skill in the art will recognize other approaches for generating reference voltages.

Figure 3B:
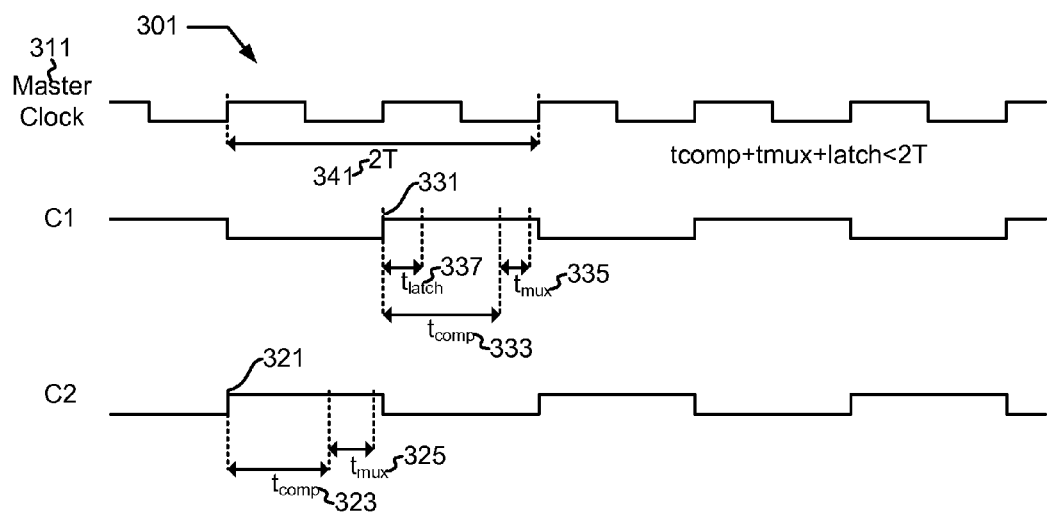

Turning to FIG. 3b, a timing diagram 301 depicts an exemplary operation of the latch based analog to digital converter 300. Clock phase c1 and clock phase c2 are generated based on a master clock 311 and are one-hundred, eighty degrees out of phase from one another. Each of latch 316 and latch 326 are transparent when its associated clock is asserted high. Thus, when clock phase c2 asserts high at a time 321, latch 316 becomes transparent. On the same clock edge, comparators 322, 324 are clocked. The outputs of comparators 322, 324 are stable after a period, $t_{comp}$ 323. The output of the selected comparator transitions through multiplexer 350 after a period, $t_{mux}$ 325. At this point, output A2 is stable. A2 is provided to latch 326 which becomes transparent once clock phase c1 asserts high at a time 331. A2 is available as the select input of multiplexer 340 after a period, $t_{latch}$ 337, and the outputs of comparators 312, 314 are stable after a period, $t_{comp}$ 333. Where $t_{latch}$ 337 plus the time when A2 is available is less than $t_{comp}$ 333, $t_{latch}$ 337 does not play an integral part in the critical timing path of latch based analog to digital converter 300. It should be noted that latch based analog to digital converter 300 still operates correctly even where A2 becomes available substantially after the rising edge of clock phase c1 because to the operational characteristics of latch 316. In particular, where A2 becomes available before the end of period $t_{comp}$ 333, the delay on output A2 does not have an impact on the critical timing path. Thus, use of latches 316, 326 in place of a flip-flop yields an increase in throughput. In particular, in a two interleave design such as that depicted in FIG. 3a, the data from one interleave (i.e., A1 or A2) launched from the rising edge of one clock phase (i.e., c1 or c2) must be latched by a latch (i.e., latch 316 or latch 326) before the falling edge of the other clock phase. This yields a time period 2T 341 for operation in comparison to a 1T period for a comparable flip-flop based design. In particular, the worse case timing path of latch based analog to digital converter 300 is defined by the following equation:

$$t_{comp}+t_{mux}+t_{latch}<2T.$$

Thus, as an example, where $t_{comp}$ is 120 ps, $t_{mux}$ is 60 ps and $t_{latch}$ is 60 ps, an 8.3 GHz data rate can be supported. The output of the selected comparator transitions through multiplexer 340 after a period, $t_{mux}$ 335. At this point, output A1 is stable. The above mentioned process is repeated where A1 is used to select the output from multiplexer 350.

Latch based analog to digital converter 300 operates as an asynchronous circuit due to the transparent operation of latches 316, 326. However, latch based analog to digital converter 300 does not include any asynchronous loops and is capable of achieving a higher throughput rate than a corresponding circuit relying on flip-flops in place of latches 316, 326. Further, the data rate can be increased by increasing the number of interleaves.

Figures 4A, 4B:
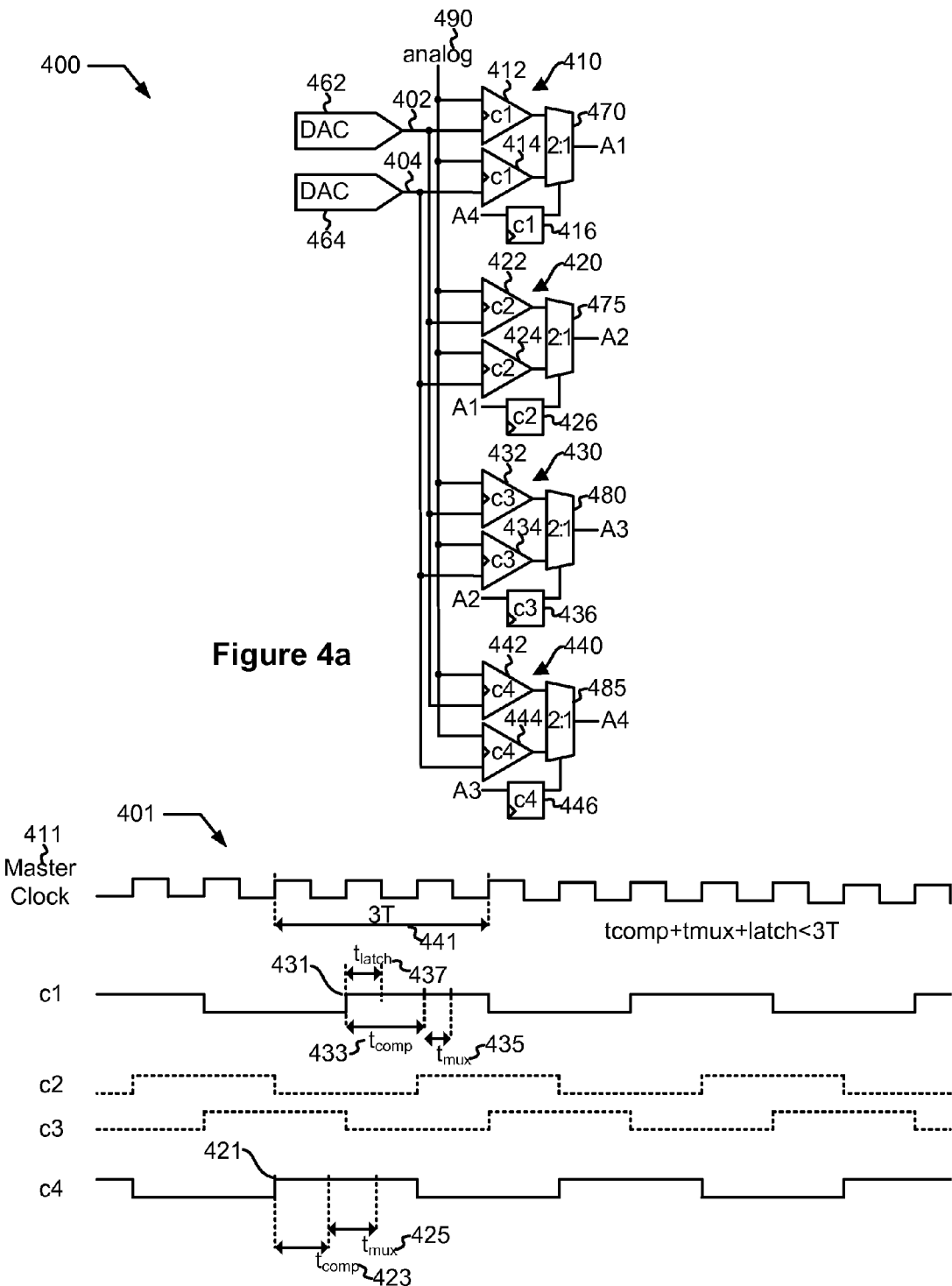

Turning to FIG. 4a, another latch based analog to digital converter 400 including an increased level of interleaving in accordance with various embodiments of the present invention. In particular, latch based analog to digital converter 400 incorporates a one tap DFE with one bit of speculation and four levels of interleave. Latch based analog to digital converter 400 includes four sub-level interleaves 410, 420, 430, 440. Sub-level interleave 410 includes two comparators 412, 414 that each receive a respective reference voltage 402, 404 that are compared against an analog input 490. Comparators 412, 414 are both synchronized to a clock phase c1. The output of either comparator 412 or comparator 414 is selected using a multiplexer 470 based on an output A4 from sub-level interleave 440. In particular, output A4 is transferred to the select input of multiplexer 470 using a latch 416 that is synchronized to clock phase c1. An output A1 is provided from multiplexer 470.

Sub-level interleave 420 includes two comparators 422, 424 that each receive a respective reference voltage 402, 404 that are compared against analog input 490. Comparators 422, 424 are both synchronized to a clock phase c2. The output of either comparator 422 or comparator 424 is selected using a multiplexer 475 based on output A1 from sub-level interleave 410. In particular, output A1 is transferred to the select input of multiplexer 475 using a latch 426 that is synchronized to a clock phase c2. Output A2 is provided from multiplexer 475.

Sub-level interleave 430 includes two comparators 432, 434 that each receive a respective reference voltage 402, 404 that are compared against analog input 490. Comparators 432, 434 are both synchronized to a clock phase c3. The output of either comparator 432 or comparator 434 is selected using a multiplexer 480 based on output A2 from sub-level interleave 420. In particular, output A2 is transferred to the select input of multiplexer 480 using a latch 436 that is synchronized to a clock phase c3. Output A3 is provided from multiplexer 480.

Sub-level interleave 440 includes two comparators 442, 444 that each receive a respective reference voltage 402, 404 that are compared against analog input 490. Comparators 442, 444 are both synchronized to a clock phase c4. The output of either comparator 442 or comparator 444 is selected using a multiplexer 485 based on output A3 from sub-level interleave 430. In particular, output A3 is transferred to the select input of multiplexer 485 using a latch 446 that is synchronized to a clock phase c4. Output A4 is provided from multiplexer 485.

Reference voltages 402, 404 may be provided from respective one of digital to analog converters 462, 464. Digital to analog converters 462, 464 may receive digital inputs from some programmable device (not shown) that allow for modification of reference voltages 402, 404. In other cases, reference voltages 402, 404 may be provided from a resistor chain. Based on the disclosure provided herein, one of ordinary skill in the art will recognize other approaches for generating reference voltages.

Turning to FIG. 4b, a timing diagram 401 depicts an exemplary operation of the latch based analog to digital converter 400. Clock phase c1, clock phase c2, clock phase c3, and clock phase c4 are generated based on a master clock 411 and are ninety degrees out of phase from one another. Each of latch 416, latch 426, latch 436 and latch 446 are transparent when its associated clock is asserted high. Thus, when clock phase c4 asserts high at a time 421, latch 446 becomes transparent. On the same clock edge, comparators 442, 444 are clocked. The outputs of comparators 442, 444 are stable after a period, $t_{comp}$ 423. The output of the selected comparator transitions through multiplexer 485 after a period, $t_{mux}$ 425. At this point, output A4 is stable. A4 is provided to latch 416 which becomes transparent once clock phase c1 asserts high at a time 431. A4 is available as the select input of multiplexer 470 after a period, $t_{latch}$ 437, and the outputs of comparators 412, 414 are stable after a period, $t_{comp}$ 433. Where $t_{latch}$ 437 plus the time when A4 is available is less than $t_{comp}$ 433, $t_{latch}$ 437 does not play an integral part in the critical timing path of latch based analog to digital converter 400. It should be noted that latch based analog to digital converter 400 still operates correctly even where A4 becomes available substantially after the rising edge of clock phase c1 because to the operational characteristics of latch 416. In particular, where A4 becomes available before the end of period $t_{comp}$ 433, the delay on output A4 does not have an impact on the critical timing path. Thus, use of latches 416, 426 in place of a flip-flop yields an increase in throughput. In particular, in a four interleave design such as that depicted in FIG. 4a, the data from one interleave (i.e., A1, A2, A3 or A4) launched from the rising edge of one clock phase (i.e., c1, c2, c3 or c4) must be latched by a latch (i.e., one of latches 416, 426, 436, 446) before the falling edge of the clock phase associated with latching the particular output. This yields a time period 4T 441 for operation. The worse case timing path of latch based analog to digital converter 300 is defined by the following equation:

$$t_{comp}+t_{mux}+t_{latch}<3T.$$

Thus, as an example, where $t_{comp}$ is 120 ps, $t_{mux}$ is 60 ps and $t_{latch}$ is 60 ps, a 12.5 GHz data rate can be supported. The output of the selected comparator transitions through multiplexer 470 after a period, $t_{mux}$ 435. At this point, output A1 is stable. The above mentioned process is repeated where A1 is used to select the output from multiplexer 475, A2 is used to select the output from multiplexer 480, and A3 is used to select the output from multiplexer 485.

Figure 5A:
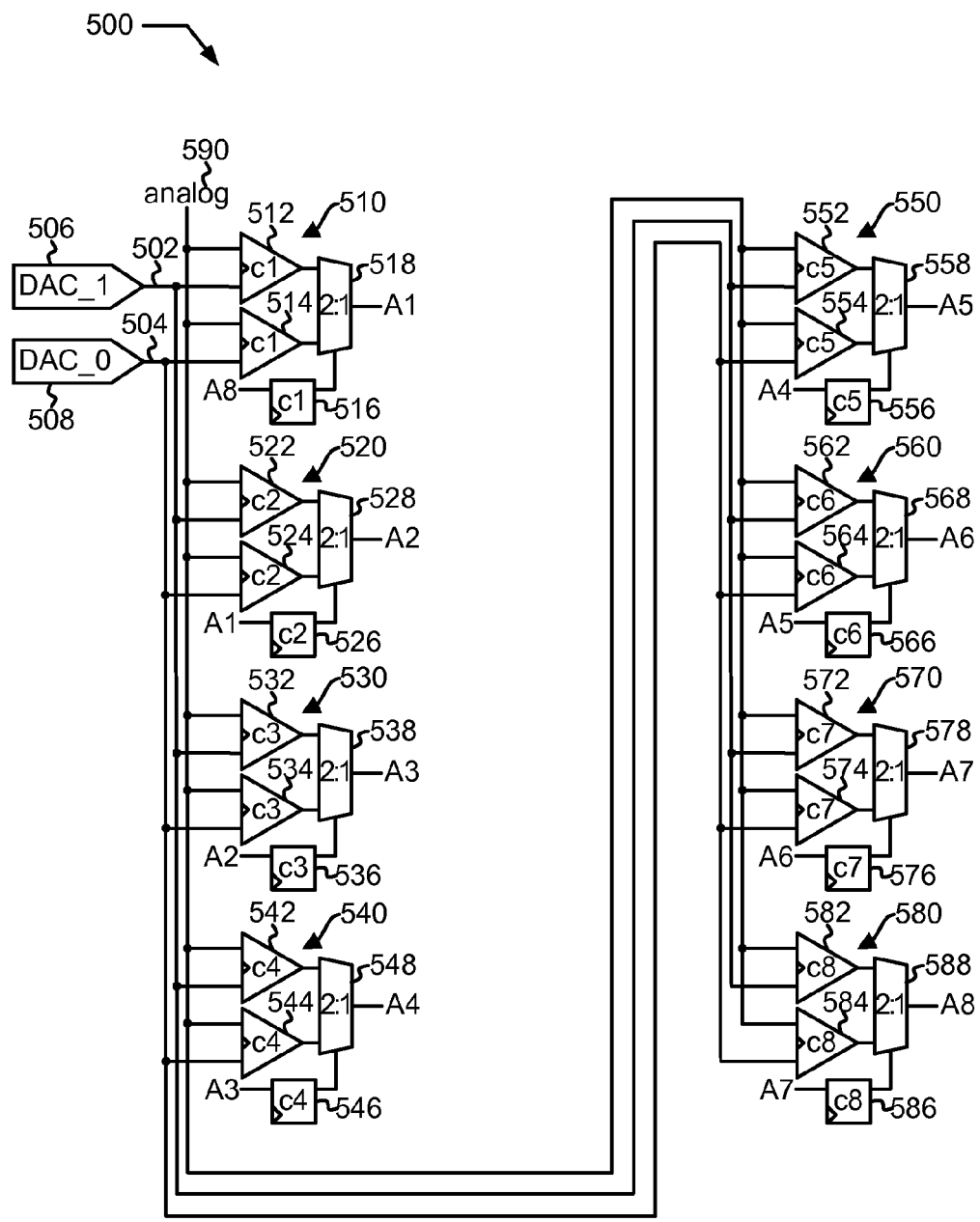
FIG. 5a depicts yet another latch based analog to digital converter in accordance with one or more embodiments of the present invention.

Turning to FIG. 5a, yet another latch based analog to digital converter 500 including a further increased level of interleaving in accordance with various embodiments of the present invention. In particular, latch based analog to digital converter 500 incorporates a one tap DFE with one bit of speculation and eight levels of interleave. Latch based analog to digital converter 500 includes eight sub-level interleaves 510, 520, 530, 540, 550, 560, 570, 580. Sub-level interleave 510 includes two comparators 512, 514 that each receive a respective reference voltage 502, 504 that are compared against an analog input 590. Comparators 512, 514 are both synchronized to a clock phase c1. The output of either comparator 512 or comparator 514 is selected using a multiplexer 418 based on an output A8 from sub-level interleave 580. In particular, output A8 is transferred to the select input of multiplexer 518 using a latch 516 that is synchronized to clock phase c1. An output A1 is provided from multiplexer 518.

Sub-level interleave 520 includes two comparators 522, 524 that each receive a respective reference voltage 502, 504 that are compared against analog input 590. Comparators 522, 524 are both synchronized to a clock phase c2. The output of either comparator 522 or comparator 524 is selected using a multiplexer 528 based on output A1 from sub-level interleave 510. In particular, output A1 is transferred to the select input of multiplexer 528 using a latch 526 that is synchronized to a clock phase c2. Output A2 is provided from multiplexer 528.

Sub-level interleave 530 includes two comparators 532, 534 that each receive a respective reference voltage 502, 504 that are compared against analog input 590. Comparators 532, 534 are both synchronized to a clock phase c3. The output of either comparator 532 or comparator 534 is selected using a multiplexer 538 based on output A2 from sub-level interleave 520. In particular, output A2 is transferred to the select input of multiplexer 538 using a latch 536 that is synchronized to a clock phase c3. Output A3 is provided from multiplexer 538.

Sub-level interleave 540 includes two comparators 542, 544 that each receive a respective reference voltage 502, 504 that are compared against analog input 590. Comparators 542, 544 are both synchronized to a clock phase c4. The output of either comparator 542 or comparator 544 is selected using a multiplexer 548 based on output A3 from sub-level interleave 530. In particular, output A3 is transferred to the select input of multiplexer 548 using a latch 546 that is synchronized to a clock phase c4. Output A4 is provided from multiplexer 548.

Sub-level interleave 550 includes two comparators 552, 554 that each receive a respective reference voltage 502, 504 that are compared against analog input 590. Comparators 552, 554 are both synchronized to a clock phase c4. The output of either comparator 552 or comparator 554 is selected using a multiplexer 558 based on output A4 from sub-level interleave 540. In particular, output A4 is transferred to the select input of multiplexer 558 using a latch 556 that is synchronized to a clock phase c5. Output A5 is provided from multiplexer 558.

Sub-level interleave 560 includes two comparators 562, 564 that each receive a respective reference voltage 502, 504 that are compared against analog input 590. Comparators 562, 564 are both synchronized to a clock phase c6. The output of either comparator 562 or comparator 564 is selected using a multiplexer 568 based on output A5 from sub-level interleave 550. In particular, output A5 is transferred to the select input of multiplexer 568 using a latch 566 that is synchronized to a clock phase c6. Output A6 is provided from multiplexer 568.

Sub-level interleave 570 includes two comparators 572, 574 that each receive a respective reference voltage 502, 504 that are compared against analog input 590. Comparators 572, 574 are both synchronized to a clock phase c4. The output of either comparator 572 or comparator 574 is selected using a multiplexer 578 based on output A6 from sub-level interleave 560. In particular, output A6 is transferred to the select input of multiplexer 578 using a latch 576 that is synchronized to a clock phase c7. Output A7 is provided from multiplexer 578.

Sub-level interleave 580 includes two comparators 582, 584 that each receive a respective reference voltage 502, 504 that are compared against analog input 590. Comparators 582, 584 are both synchronized to a clock phase c8. The output of either comparator 582 or comparator 584 is selected using a multiplexer 588 based on output A7 from sub-level interleave 570. In particular, output A7 is transferred to the select input of multiplexer 588 using a latch 586 that is synchronized to a clock phase c8. Output A8 is provided from multiplexer 588.

Reference voltages 502, 504 may be provided from respective one of digital to analog converters 506, 508. Digital to analog converters 506, 508 may receive digital inputs from some programmable device (not shown) that allow for modification of reference voltages 502, 504. In other cases, reference voltages 502, 504 may be provided from a resistor chain. Based on the disclosure provided herein, one of ordinary skill in the art will recognize other approaches for generating reference voltages.

Figure 5B:
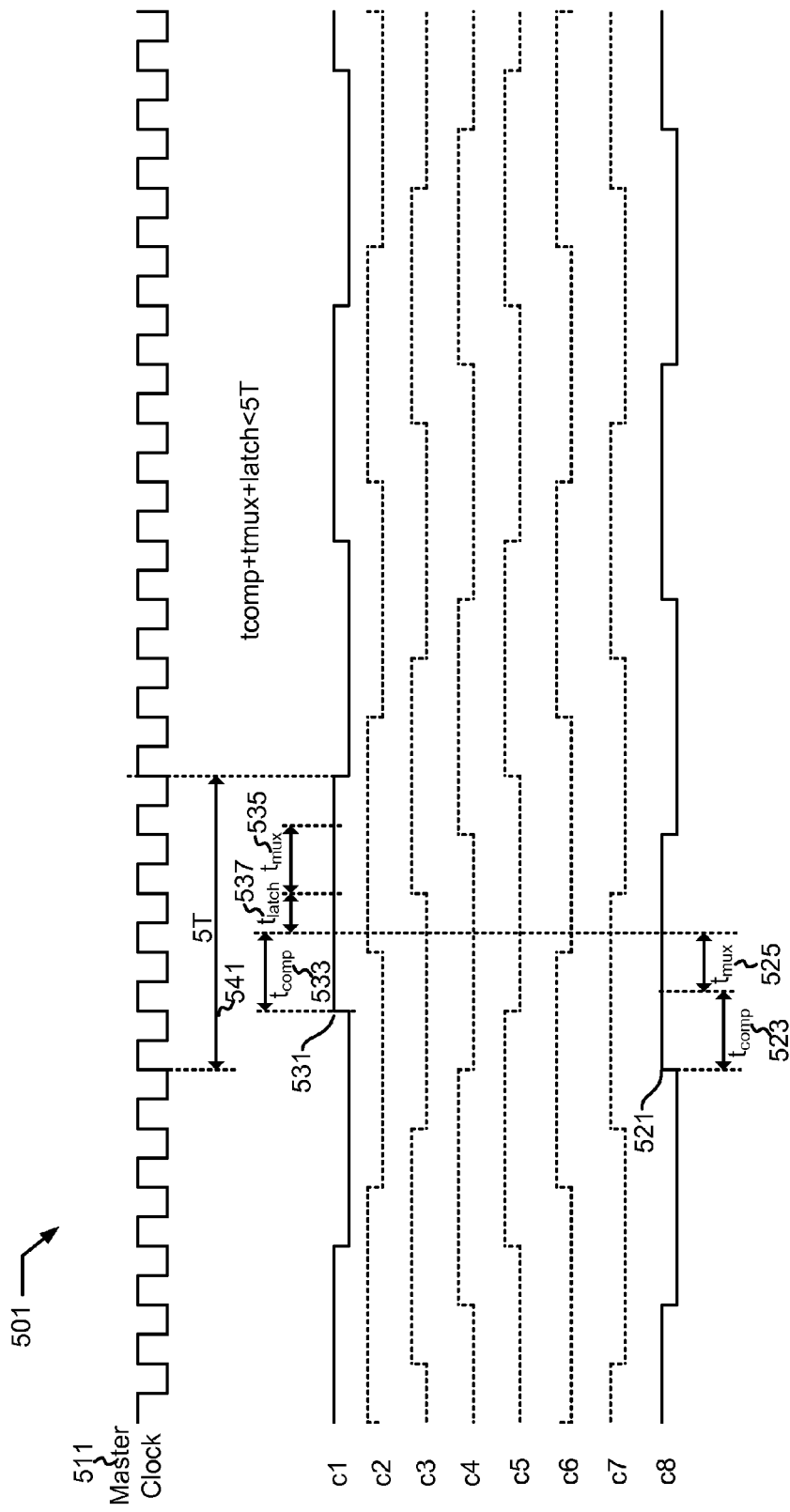

Turning to FIG. 5b, a timing diagram 501 depicts an exemplary operation of the latch based analog to digital converter 500. Clock phases c1, c2, c3, c4, c5, c6, c7 and c8 are generated based on a master clock 511 and are forty-five degrees out of phase from one another. Each of latch 516, latch 526, latch 536, latch 546, latch 556, latch 566, latch 576 and latch 586 are transparent when its associated clock is asserted high. Thus, when clock phase c8 asserts high at a time 521, latch 586 becomes transparent. On the same clock edge, comparators 582, 584 are clocked. The outputs of comparators 582, 584 are stable after a period, $t_{comp}$ 523. The output of the selected comparator transitions through multiplexer 588 after a period, $t_{mux}$ 525. At this point, output A8 is stable. A8 is provided to latch 516 which becomes transparent once clock phase c1 asserts high at a time 531. A8 is available as the select input of multiplexer 518 after a period, $t_{latch}$ 537, and the outputs of comparators 512, 514 are stable after a period, $t_{comp}$ 533. Where $t_{latch}$ 537 plus the time when A8 is available is less than $t_{comp}$ 533, $t_{latch}$ 537 does not play an integral part in the critical timing path of latch based analog to digital converter 500. It should be noted that latch based analog to digital converter 500 still operates correctly even where A8 becomes available substantially after the rising edge of clock phase c1 because to the operational characteristics of latch 516. In particular, where A8 becomes available before the end of period $t_{comp}$ 533, the delay on output A8 does not have an impact on the critical timing path. Thus, use of latches 516, 526 in place of a flip-flop yields an increase in throughput. In particular, in a four interleave design such as that depicted in FIG. 5a, the data from one interleave (i.e., A1, A2, A3, A4, A5, A6, A7 or A8) launched from the rising edge of one clock phase (i.e., c1, c2, c3, c4, c5, c6, c7 or c8) must be latched by a latch (i.e., one of latches 516, 526, 536, 546, 556, 566, 576, 586) before the falling edge of the clock phase associated with latching the particular output. This yields a time period 5T 541 for operation. The worse case timing path of latch based analog to digital converter 300 is defined by the following equation:

$$t_{comp}+t_{mux}+t_{latch}<5T.$$

Thus, as an example, where $t_{comp}$ is 120 ps, $t_{mux}$ is 60 ps and $t_{latch}$ is 60 ps, a 21 GHz data rate can be supported. The output of the selected comparator transitions through multiplexer 518 after a period, $t_{mux}$ 535. At this point, output A1 is stable. The above mentioned process is repeated where A1 is used to select the output from multiplexer 528, A2 is used to select the output from multiplexer 538, A3 is used to select the output from multiplexer 548, A4 is used to select the output from multiplexer 558, A5 is used to select the output from multiplexer 568, A6 is used to select the output from multiplexer 578, and A7 is used to select the output from multiplexer 588.

Figure 6A:
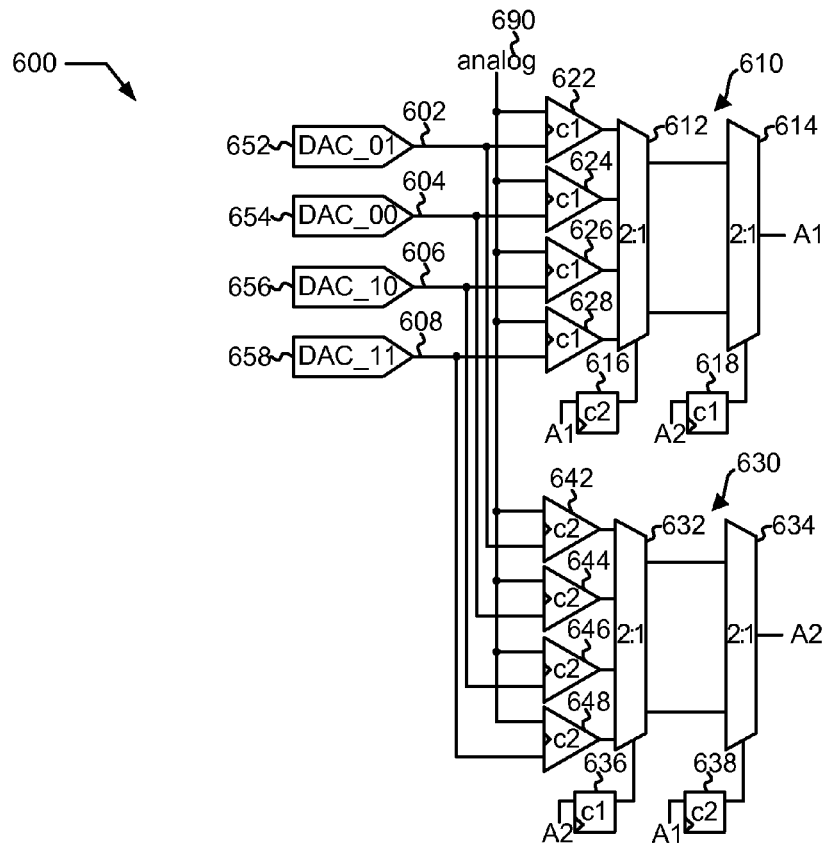
FIG. 6a depicts yet an additional latch based analog to digital converter in accordance with some embodiments of the present invention.

Further, it should be noted that while the latch based analog to digital converters of FIGS. 3a, 4a and 5a above utilize a single tap, that more than one tap may be utilized depending upon the level of inter symbol interference that is to be mitigated by the particular circuit. Turning to FIG. 6a, a latch based analog to digital converter 600 including two taps with two bits of speculation and two interleaves is depicted. In particular, latch based analog to digital converter 600 includes two sub-level interleaves 610, 630. Sub-level interleave 610 includes four comparators 622, 624, 626, 628 that each receive a respective reference voltage 602, 604, 606, 608 that are compared against an analog input 690. The number of taps (tp) is directly related to the number of comparators utilized in accordance with the following equation:

$$\text{Number of Comparators}=2^{tp}.$$

Comparators 622, 624, 626, 628 are all synchronized to a clock phase c1. The output of one of comparators 622, 624, 626, 628 is selected using a multiplexer tree consisting of a first tier multiplexer 612 and a second tier multiplexer 614 based on a combination of an output A2 from sub-level interleave 630 and an output A1 from second tier multiplexer 614. In particular, output A2 is transferred to the select input of second tier multiplexer 614 using a latch 618, and output A1 is transferred to the select input of first tier multiplexer 612 using a latch 616. Latch 616 is synchronized to clock phase c2, and latch 618 is synchronized to clock phase c1. An output A1 is provided from second tier multiplexer 614.

Sub-level interleave 630 includes four comparators 642, 644, 646, 648 that each receive a respective reference voltage 602, 604, 606, 608 that are compared against an analog input 690. Comparators 642, 644, 646, 648 are all synchronized to a clock phase c2. The output of one of comparators 642, 644, 646, 648 is selected using a multiplexer tree consisting of a first tier multiplexer 632 and a second tier multiplexer 634 based on a combination of an output A1 from sub-level interleave 610 and an output A2 from second tier multiplexer 634. In particular, output A1 is transferred to the select input of second tier multiplexer 634 using a latch 638, and output A2 is transferred to the select input of first tier multiplexer 632 using a latch 636. Latch 636 is synchronized to clock phase c1, and latch 638 is synchronized to clock phase c2. An output A2 is provided from second tier multiplexer 634.

Reference voltages 602, 604, 606, 608 may be provided from respective one of digital to analog converters 652, 654, 656, 658. Digital to analog converters 652, 654, 656, 658 may receive digital inputs from some programmable device (not shown) that allow for modification of reference voltages 602, 604, 606, 608. In other cases, reference voltages 602, 604, 606, 608 may be provided from a resistor chain. Based on the disclosure provided herein, one of ordinary skill in the art will recognize other approaches for generating reference voltages.

Figure 6B:
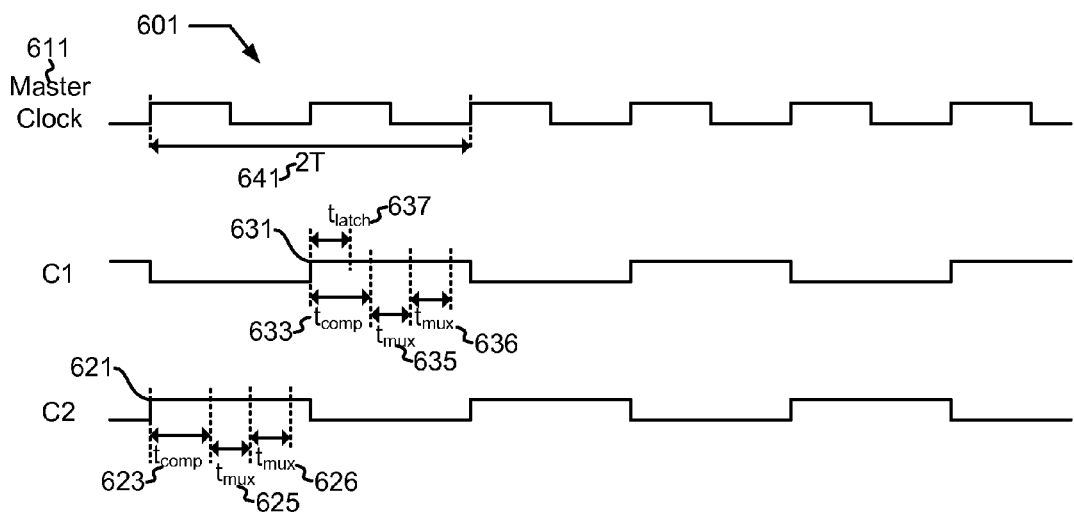

Turning to FIG. 6b, a timing diagram 601 depicts an exemplary operation of the latch based analog to digital converter 600. Clock phase c1 and clock phase c2 are generated based on a master clock 611 and are one-hundred, eighty degrees out of phase from one another. Each of latches 616, 618, 636, 638 are transparent when its associated clock is asserted high. Thus, when clock phase c2 asserts high at a time 621, latch 616 and latch 638 become transparent. On the same clock edge, comparators 642, 644, 646, 648 are clocked. The outputs of comparators 642, 644, 646, 648 are stable after a period, tcomp 623. The output of the selected comparator transitions through the multiplexer tree after two multiplexer delays, tmux 625 and tmux 626, corresponding to the delay through first tier multiplexer 632 and second tier multiplexer 634. At this point, output A2 is stable.

A2 is provided to latch 636 and latch 618 which both become transparent once clock phase c1 asserts high at a time 631. A2 is available as the select input of second tier multiplexer 614 after a period, tlatch 637, and the outputs of comparators 622, 624, 626, 628 are stable after a period, tcomp 633. Where tlatch 637 plus the time when A2 is available is less than tcomp 633, tlatch 637 does not play an integral part in the critical timing path of latch based analog to digital converter 600. It should be noted that latch based analog to digital converter 600 still operates correctly even where A2 becomes available substantially after the rising edge of clock phase c1 because to the operational characteristics of latch 618 and because the output of latch 618 drives the select input of second tier multiplexer 614. In particular, where A2 becomes available before the end of period tcomp 633 and tmux 635, the delay on output A2 does not have an impact on the critical timing path. Thus, use of latches 616, 618, 636, 638 in place of a flip-flop yields an increase in throughput. In particular, in a two interleave design such as that depicted in FIG. 6a, the data from one interleave (i.e., A1 or A2) launched from the rising edge of one clock phase (i.e., c1 or c2) must be latched by a latch (i.e., latch 316 or latch 326) before the falling edge of the other clock phase. In particular, the worse case timing path of latch based analog to digital converter 600 is defined by the following equation:

$$t\text{comp}+(2)t\text{mux}+t\text{latch}<2T.$$

Thus, as an example, where tcomp is 120 ps, tmux is 60 ps and tlatch is 60 ps, a 6.7 GHz data rate can be supported. The output of the selected comparator transitions through the multiplexer tree after a period, tmux 635+tmux 636. At this point, output A1 is stable. The above mentioned process is repeated where A1 is used to select the output from second tier multiplexer 614.

Based on the disclosure provided herein, one of ordinary skill in the art will recognize that the architecture utilized in the above described analog to digital converters may be expanded to any number of interleaves to yield additional timing advantages. In general, with a defined number of taps (tp) using speculation on all tp history bits, and a defined number of interleaves (i), the following equation describes the critical timing path:

$$t_{comp}+(tp)t_{mux}+t_{latch}<(i/2+1)/T.$$

In general, a DFE incorporated into an analog to digital converter consistent with that described in relation to FIGS. 3a, 4a, 5a and 6a above is described by the number of taps (i.e., tp) which corresponds to the amount of inter symbol interference that is mitigated. I large number of taps is able to detect a bit sequence transmitted through a poor channel with a significant amount of inter symbol interference. The above mentioned latch based analog to digital converters can operate at a very high data rate without expending excessive power. Where a large number of interleaves are used, it may be necessary to include a fanout buffer as is known in the art. Accounting for this fanout buffer, a generalized timing constraint for a latch based analog to digital converter in accordance with some embodiments of the present invention is described by the following equation:

$$T=\frac{t_{comp}+t_{latch}+(tp)t_{max}+\log_4\left(\frac{3*2^{tp}}{4}\right)t_{buf}}{(i/2)+1},$$

where $t_{comp}$ is the delay through a comparator, $t_{latch}$ is the delay through a latch, $t_{buf}$ is a delay through a fanout buffer, tp is the number of taps, i is the number of interleaves, 2tp is the number multiplexers, $3*2^{tp}$ is the number of gates, and $$\log_4\left(\frac{3*2^{tp}}{4}\right)$$

is the number of fanout buffers. The power consumed by such a latch based analog to digital converter is described by:

$$P=2^{tp}*e_{dac}+\frac{i*2^{tp}*e_{comp}+i*tp*e_{latch}+i*2^{tp}*e_{max}+i*\sum_{k=0}^{\log_4(\frac{3*2tp}{4})-1}2^k*e_{buf}}{i*T},$$

where $e_{dac}$ is the energy of the digital to analog converter, $e_{comp}$ is the energy of the comparator, $e_{latch}$ is the energy of the latch, $e_{mux}$ is the energy of the multiplexer, $e_{buf}$ is the energy of the buffer, tp is the number of taps, i is the number of interleaves, $2^{tp}$ is the number of digital to analog converters, i*tp is the number of latches, and the summation is the number of fanout buffers, each of which is exponentially larger than the previous.

Figure 1:
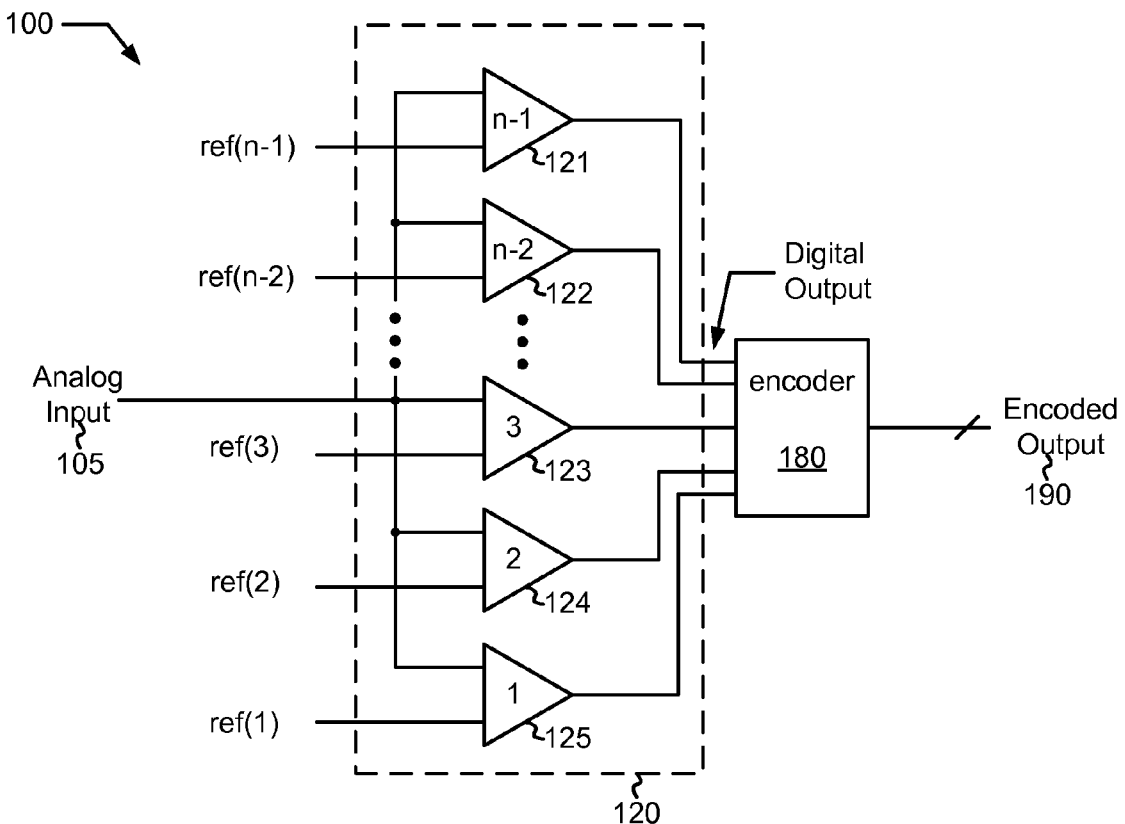
FIG. 1 depicts a prior art flash analog to digital converter.
Figure 7:
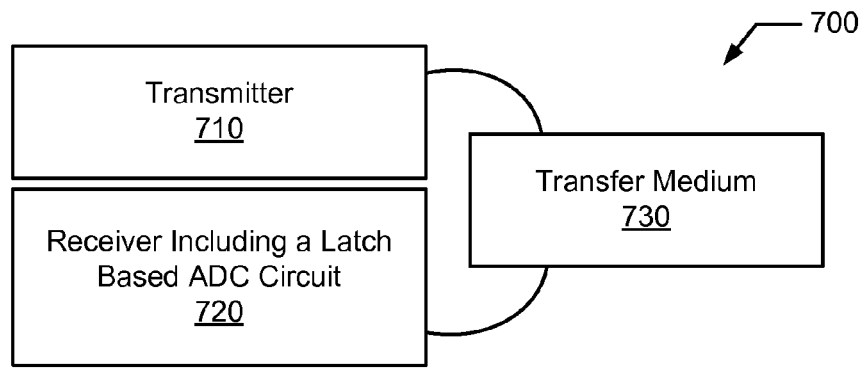
FIG. 7 depicts a communication system including a latch based analog to digital converter in accordance with some embodiments of the present invention.

Turning to FIG. 7, a communication system 700 including a receiver 720 with a latch based analog to digital converter is shown in accordance with some embodiments of the present invention. Communication system 700 includes a transmitter 710 that transmits a signal representing a data set to receiver 720 via a transfer medium 730. Transfer medium 730 may be, but is not limited to, a wireless transfer medium, a electrically wired transfer medium, a magnetic storage medium, or an optical transfer medium. Based on the disclosure provided herein, one of ordinary skill in the art will recognize a variety of transfer media that may be used in relation to different embodiments of the present invention. Receiver 720 includes a latch based analog to digital converter similar to that described above in relation to FIGS. 3-6 above. In some cases, communication system 700 may be a cellular telephone system with transmitter 710 and receiver 720 being cell phones and/or cell towers. Alternatively, communication system 700 may be a magnetic storage medium with transmitter 710 being a write function, transfer medium 730 being a magnetic storage medium, and receiver 720 being a read function. Based on the disclosure provided herein, one of ordinary skill in the art will recognize a variety of other systems that may be represented as communication system 700 in accordance with different embodiments of the present invention.

In conclusion, the invention provides novel systems, devices, methods and arrangements for analog to digital conversion. While detailed descriptions of one or more embodiments of the invention have been given above, various alternatives, modifications, and equivalents will be apparent to those skilled in the art without varying from the spirit of the invention. For example, while different embodiments of the present invention have been depicted with a particular number of taps and/or levels of interleaving, it will be understood that an arbitrary number of taps and/or interleaves may be supported in accordance with different embodiments of the present invention. Therefore, the above description should not be taken as limiting the scope of the invention, which is defined by the appended claims.

What is claimed is:

1. A latch based analog to digital converter circuit, the circuit comprising:
   a first interleave including:
      a set of comparators operable to compare an analog input with respective reference voltages, wherein the set of comparators is synchronous to a clock phase;
      a selector circuit operable to select an output of one of the set of comparators based at least in part on a selector input, wherein a first interleave output is derived from the selected output; and
      a latch that receives a second interleave output from a second interleave and is transparent when the clock phase is asserted, and wherein the selector input includes an output of the latch.

2. The circuit of claim 1, wherein the latch operates to mitigate inter symbol interference.

3. The circuit of claim 1, wherein the set of comparators is a first set of comparators, wherein the clock phase is a first clock phase, wherein the selector circuit is a first selector circuit, wherein the selector input is a first selector input, wherein the latch is a first latch, and wherein the second interleave includes:
   a second set of comparators synchronized to a second clock phase;
   a second selector circuit operable to select an output of one of the second set of comparators based at least in part on a second selector input, wherein the second interleave output is derived from the selected output; and
   a second latch that receives the first interleave output and is transparent when the second clock phase is asserted, and wherein the second selector input is an output of the second latch.

4. The circuit of claim 3, wherein the first latch and the second latch operate to mitigate inter symbol interference.

5. The circuit of claim 3, wherein the analog to digital converter circuit incorporating the first latch operating as a one-tap DFE and the second latch operating as a one-tap DFE, wherein the first set of comparators includes two comparators, and wherein the second set of comparators includes two comparators.

6. The circuit of claim 1, wherein the set of comparators is a first set of comparators, wherein the clock phase is a first clock phase, wherein the selector circuit is a first selector circuit, wherein the selector input is a first selector input, wherein the latch is a first latch, and wherein the circuit further comprises:
   a third interleave including:
      a third set of comparators operable to compare the analog input with the respective reference voltages, wherein the third set of comparators is synchronous to a third clock phase;
      a third selector circuit operable to select an output of one of the third set of comparators based at least in part on a third selector input, wherein a third interleave output is derived from the selected output; and
      a third latch that receives the first interleave output and is transparent when the third clock phase is asserted, and wherein the third selector input is an output of the third latch;
   a fourth interleave including:
      a fourth set of comparators operable to compare the analog input with the respective reference voltages, wherein the fourth set of comparators is synchronous to a fourth clock phase;
      a fourth selector circuit operable to select an output of one of the fourth set of comparators based at least in part on a fourth selector input, wherein a fourth interleave output is derived from the selected output; and
      a fourth latch that receives the third interleave output and is transparent when the fourth clock phase is asserted, and wherein the fourth selector input is an output of the fourth latch; and
   wherein the second interleave includes:
      a second set of comparators operable to compare the analog input with the respective reference voltages, wherein the second set of comparators is synchronous to a second clock phase;
      a second selector circuit operable to select an output of one of the second set of comparators based at least in part on a second selector input, wherein the second interleave output is derived from the selected output; and
      a second latch that receives the fourth interleave output and is transparent when the second clock phase is asserted, and wherein the second selector input is an output of the second latch.

7. The circuit of claim 1, wherein the latch is a first latch, wherein the clock phase is a first clock phase, and wherein the circuit further comprises:
   a second latch that receives the first interleave output and is transparent when a second clock phase is asserted, and wherein the selector input includes an output of the first latch and an output of the second latch.

8. The circuit of claim 7, wherein the selector circuit is a multi-tier multiplexer, wherein the output of the second latch is used as a selector input to a first tier of the multi-tier multiplexer, and wherein the output of the first latch is used as a selector input to a second tier of the multi-tier multiplexer.

9. The circuit of claim 7, wherein the set of comparators is a first set of comparators, wherein the selector circuit is a first selector circuit, wherein the selector input is a first selector input, and wherein the second interleave includes:
- a second set of comparators synchronized to the second clock phase;
- a second selector circuit operable to select an output of one of the second set of comparators based at least in part on a second selector input, wherein the second interleave output is derived from the selected output; and
- a third latch that receives the first interleave output and is transparent when the second clock phase is asserted,
- a fourth latch that receives the second interleave output and is transparent when the first clock phase is asserted, and wherein the second selector input includes the output of the third latch and the output of the fourth latch.

10. The circuit of claim 9, wherein the first selector circuit is a first multi-tier multiplexer, wherein the second selector circuit is a second multi-tier multiplexer, wherein the output of the second latch is used as a selector input to a first tier of the first multi-tier multiplexer, wherein the output of the first latch is used as a selector input to a second tier of the first multi-tier multiplexer; wherein the output of the fourth latch is used as a selector input to a first tier of the second multi-tier multiplexer; and wherein the output of the third latch is used as a selector input to a second tier of the second multi-tier multiplexer.

11. The circuit of claim 9, wherein the first latch, the second latch, the third latch and the fourth latch operate to mitigate inter symbol interference.

12. A method for analog to digital conversion, the method comprising:
- providing a first interleave operable to generate a first output and a second interleave operable to generate a second output, wherein each of the first interleave and the second interleave includes a set of comparators, a selector circuit, and a latch;
- performing a set of analog to digital conversions using the set of comparators of the first interleave synchronous to a clock phase;
- selecting a result from the set of analog to digital conversions based at least in part on a latched result to provide the first output; and
- latching the second output using the latch of the first interleave, wherein the latch is transparent when the clock phase is asserted, and wherein the latched result includes an output of the latch.

13. The method of claim 12, wherein the set of analog to digital conversions is a first set of analog to digital conversions, wherein the clock phase is a second clock phase, wherein the latched result is a first latched result, wherein the method further comprises:
- performing a second set of analog to digital conversions using the set of comparators of the second interleave synchronous to a second clock phase;
- selecting a result from the second set of analog to digital conversions based at least in part on a second latched result to provide the second output; and
- latching the first output using the latch of the second interleave, wherein the latch is transparent when the second clock phase is asserted, and wherein the second latched result includes an output of the latch.

14. A communication system, the system comprising:
- a receiver including a latch based analog to digital converter, wherein the latch based analog to digital converter includes:
  - a first interleave including:
    - a set of comparators operable to compare an analog input with respective reference voltages, wherein the set of comparators is synchronous to a clock phase;
    - a selector circuit operable to select an output of one of the set of comparators based at least in part on a selector input, wherein a first interleave output is derived from the selected output; and
    - a latch that receives a second interleave output from a second interleave and is transparent when the clock phase is asserted, and wherein the selector input includes an output of the latch.

15. The system of claim 14, wherein the system further includes a transmitter and a medium, and wherein information is provided from the transmitter to the receiver via the medium.

16. The system of claim 15, wherein the system is a storage system, and wherein the medium is a storage medium.

17. The system of claim 15, wherein the system is a wireless communication system, and wherein the medium is a wireless communication medium.

18. The system of claim 14, wherein the set of comparators is a first set of comparators, wherein the clock phase is a first clock phase, wherein the selector circuit is a first selector circuit, wherein the selector input is a first selector input, wherein the latch is a first latch, and wherein the second interleave includes:
- a second set of comparators synchronized to a second clock phase;
- a second selector circuit operable to select an output of one of the second set of comparators based at least in part on a second selector input, wherein the second interleave output is derived from the selected output; and
- a second latch that receives the first interleave output and is transparent when the second clock phase is asserted, and wherein the second selector input is an output of the second latch.

19. The system of claim 14, wherein the latch is a first latch, wherein the clock phase is a first clock phase, and wherein the latch based analog to digital converter further includes:
- a second latch that receives the first interleave output and is transparent when a second clock phase is asserted, and wherein the selector input includes an output of the first latch and an output of the second latch.

20. The system of claim 19, wherein the set of comparators is a first set of comparators, wherein the selector circuit is a first selector circuit, wherein the selector input is a first selector input, and wherein the second interleave includes:
- a second set of comparators synchronized to the second clock phase;
- a second selector circuit operable to select an output of one of the second set of comparators based at least in part on a second selector input, wherein the second interleave output is derived from the selected output; and
- a third latch that receives the first interleave output and is transparent when the second clock phase is asserted,
- a fourth latch that receives the second interleave output and is transparent when the first clock phase is asserted, and wherein the second selector input includes the output of the third latch and the output of the fourth latch.

* * * * *

UNITED STATES PATENT AND TRADEMARK OFFICE
CERTIFICATE OF CORRECTION

| | | |
|---|---|---|
| PATENT NO. | : 7,973,692 B2 | Page 1 of 1 |
| APPLICATION NO. | : 12/669482 | |
| DATED | : July 5, 2011 | |
| INVENTOR(S) | : Erik Chmelar et al. | |

It is certified that error appears in the above-identified patent and that said Letters Patent is hereby corrected as shown below:

In the Title

Title item (54) should read --SYSTEMS AND METHODS FOR LATCH BASED ANALOG TO DIGITAL CONVERSION--.

Signed and Sealed this
Eighteenth Day of October, 2011

David J. Kappos
*Director of the United States Patent and Trademark Office*

UNITED STATES PATENT AND TRADEMARK OFFICE
CERTIFICATE OF CORRECTION

PATENT NO.         : 7,973,692 B2                           Page 1 of 1
APPLICATION NO.    : 12/669482
DATED              : July 5, 2011
INVENTOR(S)        : Erik Chmelar et al.

It is certified that error appears in the above-identified patent and that said Letters Patent is hereby corrected as shown below:

Title Page, Item (54) and at Column 1, lines 1-3,

Title should read --SYSTEMS AND METHODS FOR LATCH BASED ANALOG TO DIGITAL CONVERSION--.

This certificate supersedes the Certificate of Correction issued October 18, 2011.

Signed and Sealed this
Twenty-second Day of November, 2011

David J. Kappos
*Director of the United States Patent and Trademark Office*